United States Patent
Mitrovic et al.

(10) Patent No.: US 7,233,878 B2
(45) Date of Patent: Jun. 19, 2007

(54) METHOD AND SYSTEM FOR MONITORING COMPONENT CONSUMPTION

(75) Inventors: Andrej S. Mitrovic, Phoenix, AZ (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 7 days.

(21) Appl. No.: 10/767,347

(22) Filed: Jan. 30, 2004

(65) Prior Publication Data
US 2005/0171730 A1 Aug. 4, 2005

(51) Int. Cl.
*G01N 21/88* (2006.01)
(52) U.S. Cl. .............. 702/182; 702/155; 702/159; 702/170; 702/172; 250/559.27; 356/503; 356/630
(58) Field of Classification Search ............ 438/14, 438/16; 702/155, 159, 170, 172, 182, 166, 702/157, 97, 127
See application file for complete search history.

(56) References Cited

U.S. PATENT DOCUMENTS

| | | | | |
|---|---|---|---|---|
| 5,210,646 A * | 5/1993 | Mercado et al. | ............ | 359/793 |
| 6,392,749 B1 * | 5/2002 | Meeks et al. | ............... | 356/634 |
| 6,483,585 B1 * | 11/2002 | Yang | ........................... | 356/369 |
| 6,559,942 B2 * | 5/2003 | Sui et al. | ..................... | 356/369 |
| 6,717,671 B1 * | 4/2004 | Meeks et al. | ............... | 356/369 |
| 6,810,291 B2 * | 10/2004 | Card et al. | ..................... | 700/48 |
| 6,812,047 B1 * | 11/2004 | Borden et al. | ................ | 438/16 |
| 6,943,357 B2 * | 9/2005 | Srivastava et al. | ........ | 250/458.1 |
| 2004/0014250 A1 * | 1/2004 | Peterson et al. | ............. | 438/14 |
| 2004/0040658 A1 * | 3/2004 | Usui et al. | ............. | 156/345.24 |
| 2004/0246493 A1 * | 12/2004 | Kim et al. | .................. | 356/504 |

* cited by examiner

*Primary Examiner*—Hal Wachsman
(74) *Attorney, Agent, or Firm*—Oblon, Spivak, McClelland, Maier & Neustadt, P.C.

(57) ABSTRACT

A method for monitoring consumption of a component, including the steps of emitting a radiation beam onto a first area of the component and detecting a portion of the radiation beam that is refracted by the component. A radiation level signal is generated based at least on a strength of the detected portion of the radiation beam, and a thickness of the component is determined based on the radiation level signal. The thickness of the component is compared to a predetermined thickness value, and a status signal is generated when the comparing step determines that the thickness of the component is substantially equal to or below the predetermined thickness value. When the comparing step determines that the thickness of the component is greater than the predetermined thickness value, the component is exposed to a process that can erode at least a portion of the component.

40 Claims, 3 Drawing Sheets

METHOD AND SYSTEM FOR MONITORING COMPONENT CONSUMPTION

BACKGROUND OF THE INVENTION

1. Field of the Invention

The present invention is generally related to plasma processing and, more particularly, to a method and apparatus for monitoring consumption of a component used in plasma processing.

2. Discussion of the Background

In semiconductor processing tools, certain components within a processing chamber are subjected to processing conditions that eventually cause the components to deteriorate to the extent that they must be replaced. In etch systems, for example, a chuck focus ring surrounds a wafer chuck and is subjected to erosion by the plasma and etch chemistry. After the thickness of the focus ring is reduced to a predetermined percentage of its original thickness or to a predetermined minimum thickness, the focus ring is replaced with a new one. Other examples of consumable components include inject plates, electrodes in capacitive coupled plasma reactors, chamber liners and deposition shields, and consumable parts in batch furnaces.

In practice, it is difficult to determine exactly when a consumable component must be replaced. For the sake of efficiency, a processing tool can not be taken offline after every individual tool process for the purpose of opening the processing chamber and measuring the remaining size of a consumable component. Also, a single processing tool may perform various processes using the same consumable component, and each process condition may cause the consumable component to erode at a different rate. Thus, it is difficult to predict with certainty the deterioration of a consumable component based on an elapsed usage time.

One replacement scheduling method involves corresponding a particular consumable component to a number of wafer starts; that is, the component is replaced after a certain predetermined number of wafer starts has occurred. However, this approach is cost efficient only if the tool in question is used to run the same processes on all wafer batches. In a system in which the tool is used to run different processes on different batches of wafers, such as in foundry integrated chip manufacturing plants, the wafer-start method can result in a waste of consumable part lifetime. For example, using this approach, a consumable component may be replaced after a predetermined number of wafer starts even if the performed processes did not erode the ring to the point where replacement would be necessary.

Due to the high price of consumable components, and to the high likelihood of underutilizing such parts, it is desirable to have the ability to accurately monitor the thickness of a consumable component during batch processing without stopping and/or opening the tool processing chamber. It would also be desirable to provide such monitoring ability in a simple and compact system that can be easily retrofitted to an existing processing system.

BRIEF SUMMARY OF THE INVENTION

Accordingly, the present invention advantageously provides a method and system for measuring residual thickness of a consumable part via a compact, contactless, thickness measurement system. The present invention allows consumable parts to be replaced based on actual erosion, and not on prescribed time periods or wafer start numbers.

In accordance with an aspect of the present invention, a system is provided for monitoring component consumption, where the system includes a radiation source configured to emit a radiation beam onto a first area of a component. The system also includes a detecting unit that detects a portion of the radiation beam that is refracted by the component. The detecting unit generates a radiation level signal based at least on a strength of the detected portion of the radiation beam. A control unit of the system determines a thickness of the component based on the radiation level signal, and the determined thickness is compared to a predetermined thickness value. The control unit generates a status signal when the thickness of the component is determined to be substantially equal to or below the predetermined thickness value. After the component is exposed to a process that can erode at least a portion of the component, and when the thickness of the component is determined to be greater than the predetermined thickness value, the control unit transmits a command to the radiation source and the detecting unit to generate another radiation level signal.

In accordance with another aspect of the present invention, a system is provided for monitoring component consumption, where the system includes emitting means for emitting a radiation beam onto a first area of a component. The system also includes detecting means for detecting a portion of the radiation beam that is refracted by the component, and for generating a radiation level signal based at least on a strength of the detected portion of the radiation beam. Controlling means of system are provided for determining a thickness of the component based on the radiation level signal, and comparing the thickness of the component to a predetermined thickness value. The controlling means are also provided for generating a status signal when the thickness of the component is substantially equal to or below the predetermined thickness value, and for transmitting a command to the emitting means and the detecting means to generate another radiation level signal. The command is transmitted when the thickness of the component is determined to be greater than the predetermined thickness value and after the component is exposed to a process that can erode at least a portion of the component.

In accordance with a further aspect of the present invention, a method is provided for monitoring consumption of a component. The method includes measuring a thickness of the component and comparing the thickness of the component to a predetermined thickness value. The component is then exposed to a process that can erode at least a portion of the component when the comparing step determines that the thickness of the component is greater than the predetermined thickness value. The steps of measuring, comparing, and exposing are repeated until the comparing step determines that the thickness of the component is substantially equal to or less than the predetermined thickness value. A status signal is generated when the comparing step determines that the first thickness of the component is substantially equal to or less than the predetermined thickness value.

In accordance with another aspect of the present invention, a method for monitoring consumption of a component is provided, including the steps of emitting a radiation beam onto a first area of the component and detecting a portion of the radiation beam that is refracted by the component. A radiation level signal is generated based at least on a strength of the detected portion of the radiation beam, and a thickness of the component is determined based on the radiation level signal. The thickness of the component is compared to a predetermined thickness value, and a status signal is generated when the comparing step determines that the thickness of the component is substantially equal to or below the predetermined thickness value. When the comparing step determines that the thickness of the component is greater than the predetermined thickness value, the component is exposed to a process that can erode at least a portion of the component.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
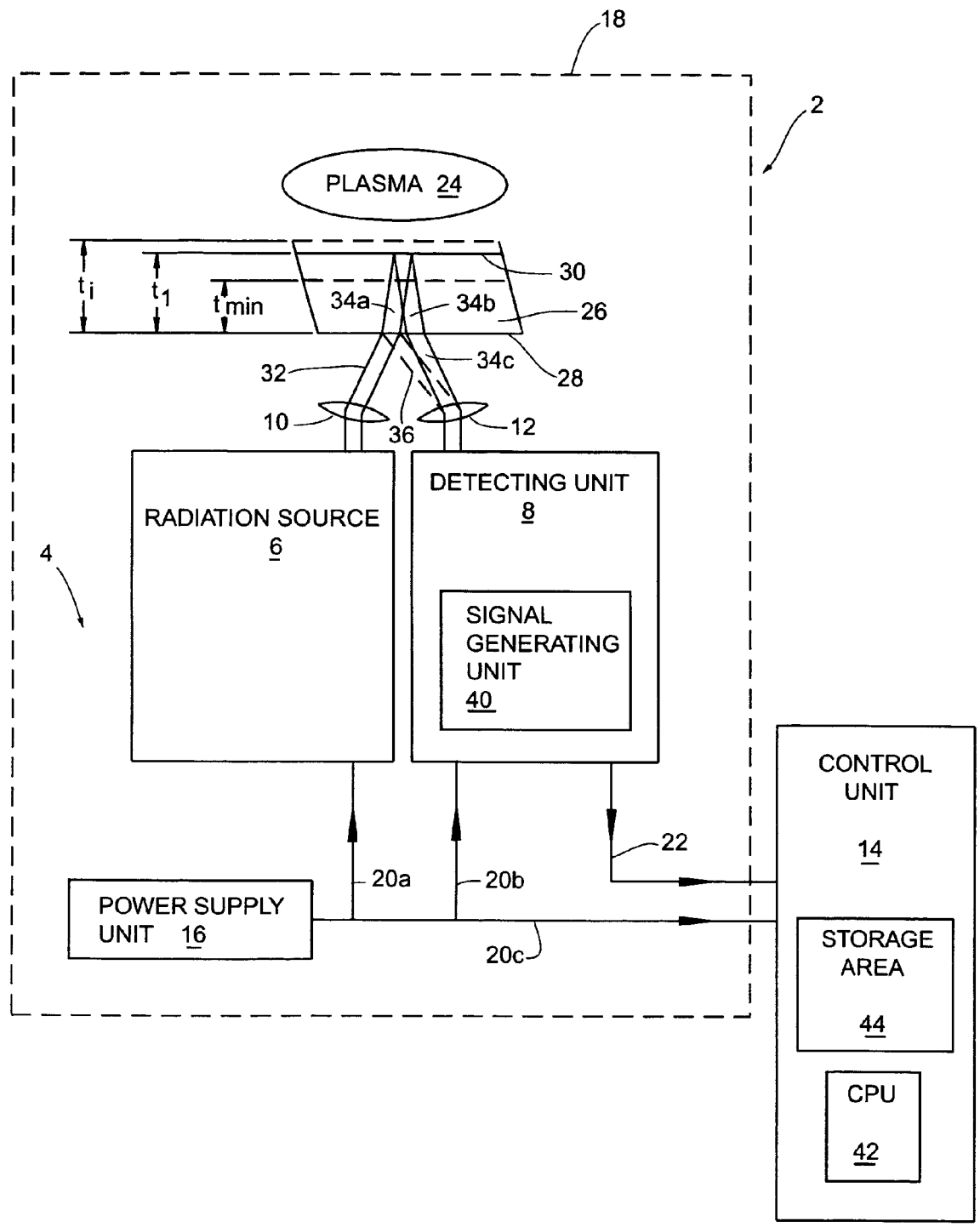
FIG. 1 is a schematic illustration of a monitoring system in accordance with an aspect of the present invention.

Referring now to the drawings, where like reference numeral designations identify the same or corresponding parts throughout the several views, several embodiments of the present invention are next described.

FIG. 1 schematically illustrates a portion of a processing tool 2 including a monitoring system 4. As non-limiting examples, the processing tool 2 can be configured as an inductively coupled plasma (ICP) system, a capacitively coupled plasma (CCP) system, a magnetically enhanced reactive ion etching (MERIE) system, or a batch thermal processing furnace. The processing tool 2 is primarily used to provide etching of a wafer (not shown) within a processing chamber 18, and such etching is performed using a plasma 24 created from gas provided by a gas source. In the case of a batch thermal processing furnace, there is no plasma 24, but there can be reactive chemistries present that erode away a consumable component 26.

The component 26 represents any part within the processing chamber 18 that can deteriorate as a result of being exposed to the plasma 24, to etch chemistry, or to any other process condition created during operation of the processing tool 2. Accordingly, the component 26 can be of any shape and/or size, depending on its desired function. For example, the component 26 can represent a chuck focus ring that surrounds a wafer-supporting chuck. The component 26 can be made of a semiconductor material, quartz, or any other material that can deteriorate during operation of the processing tool 2. Also, the component 26 can be made of a material that is transparent, translucent, or opaque at visible wavelengths. Further, the component 26 can be arranged such that all of its exposed surfaces erode during processing or only some of the exposed surfaces are eroded. For example, one portion of the component 26 can be made of a consumable material whereas another portion is made of a non-consumable material or is coated with such a material. The component 26 can be supported within the processing chamber 18 by another process component, by an interior surface of the processing chamber 18 itself, or by any other structures within the processing chamber 18.

The monitoring system 4 includes a power supply unit 16, a radiation source 6, optical systems 10 and 12, a detecting unit 8, and a control unit 14. The monitoring system 4 also includes any components that are not shown in FIG. 1, but are necessary for supporting the illustrated components of the monitoring system 4. The monitoring system 4 can represent a component set that is retrofitted to the processing tool 2 or that is integral and original to the construction of the processing tool 2. Moreover, the positions of the components of the monitoring system 4 can be adjusted to adapt to components of different sizes and shapes.

The power supply unit 16 supplies power to the radiation source 6, the detecting unit 8, and the control unit 14 via power lines 20a, 20b, and 20c, respectively. The power supply unit 26 is positioned within the processing chamber 18, but can be alternatively positioned outside of the processing chamber. The power supply unit 26 can be arranged as a single unit, as shown in FIG. 1, or can alternatively include multiple, separate supply units respectively providing power to units 6, 8, and 14. Also, the power supply unit 26 can be shared with other components of the processing tool 2. The power supply unit 26 can be arranged as a power conversion unit that draws and converts power from a system-wide power source, from batteries, or from radiofrequency power created in the processing tool 2. Alternatively, the power supply unit 26 can be arranged as any other means for generating and/or converting power that can be used in conjunction with the processing tool 2.

The radiation source 6 is positioned within the processing chamber 18 and is arranged to emit a radiation beam 32, which can be infrared light or any other radiation of a wavelength that will allow refraction, transmission, and internal reflection by the component 26. For example, if the component 26 is made of a material that is nearly transparent at visible wavelengths, then the radiation source 6 should be configured to emit visible light. For example, if the component 26 is made of silicon, as is the case with a typical focus ring, then the radiation source 6 can be arranged as an infrared radiation source, since silicon is nearly transparent in a number of infrared wavelength bands. Alternatively, any other radiation emitting unit adaptable for use in a processing tool 2 can be used.

The optical system 10 is arranged to focus a radiation beam 32 emitted from the radiation source 6 onto a first surface 28 of the component 26. In the embodiment of FIG. 1, the optical system 12 is arranged to focus a reflected beam portion 36 and a refracted beam portion 34c from the component 26 to the detecting unit 8. In an alternative embodiment, however, the radiation source 6, the detecting unit 8, and/or the optical systems 10 and 12 are positioned such that the reflected beam portion 36 is not detected by the detecting unit 8 and a determination of thickness of the component 26 is based primarily on the refracted beam portion 34c. Each of the optical systems 10 and 12 includes a single focusing lens (as shown in FIG. 1) or, alternatively, multiple lenses grouped in lens assemblies.

In the embodiment of FIG. 1, the detecting unit 8 is positioned within the processing chamber 18 and is arranged to receive the reflected beam portion 36 and the refracted beam portion 34c via the optical system 12. The detecting unit 8 includes a conventional infrared radiation detector or any other detecting means compatible with the chosen radiation source. The detecting unit 8 also includes a signal generating unit 40, which is configured to generate a radiation level signal based on the combined strength of the detected beam portions 34c and 36, or only the refracted beam portion 34c, if the reflected beam portion 36 is prevented from reaching the detector. The generated radiation level signal is transmitted to the control unit 14 via a physical line 22 or, alternatively, the signal generating unit 40 is configured to transmit the radiation level signal wirelessly to the control unit 14. The latter configuration allows for a simple retrofit solution, as a physical signal line does not need to be established through the wall of the processing chamber 18 between the detecting unit 8 and the control unit 14. Where the power supply unit 16 draws power from radiofrequency power present in the processing tool as noted above, the power lines 20a and 20b can also be eliminated to further facilitate a compact and easy to retrofit design.

The control unit 14 is arranged as a conventional processing unit or, alternatively, any other device that can be configured to perform the functions subsequently described. The control unit 14 can be positioned outside of the processing chamber 18, as shown in FIG. 1, or can be positioned within the processing chamber 18. The control unit 14 includes a central processing unit (CPU) 42 and a storage area 44, which stores calibration data and correlation data, which are used to determine component thickness based on a received radiation level signal. Correlation data is generated from experimentation with the monitoring system 4 and sample consumable components. The storage area 44 can store correlation data corresponding to various component materials used in the processing tool 2 such that the thickness for any one of these various materials can be determined once the material being measured is identified.

Figure 3:
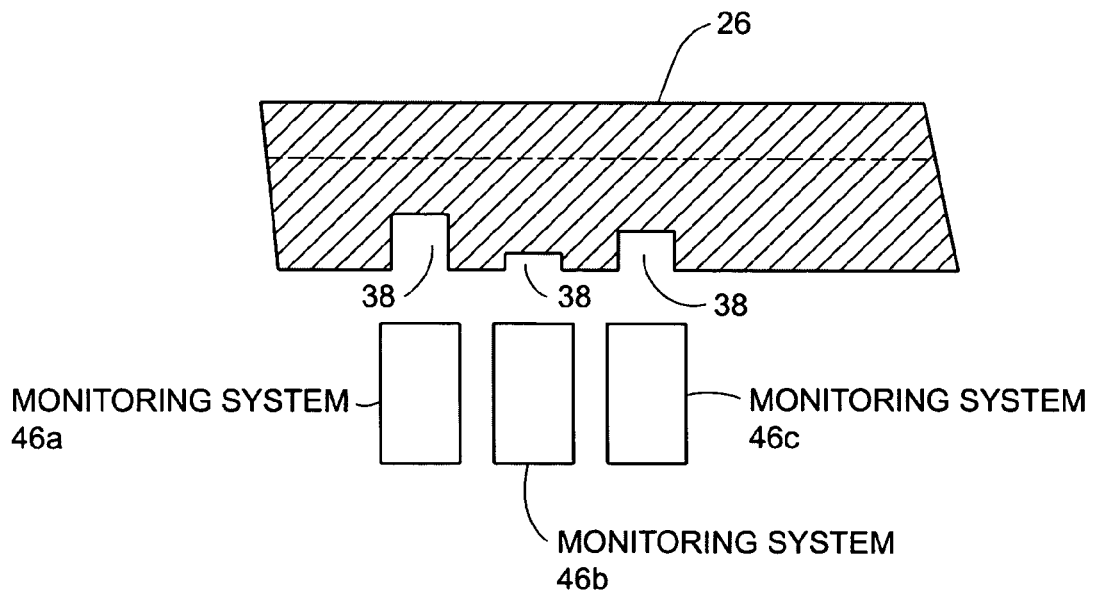
FIG. 3 is a simplified view of a plural-sensor monitoring system in accordance with another aspect of the present invention.

Alternative to the aspect of the present invention shown in FIG. 1, the processing tool 2 can include two or more monitoring systems. For example, FIG. 3 illustrates three monitoring systems 46a, 46b, and 46c arranged at different areas of the component 26. Although the three monitoring systems 46a, 46b, and 46c are arranged side-by-side in FIG. 3, they can alternatively be positioned in any configuration around the component 26. Each of these monitoring systems includes components identical to those of monitoring system 4, including separate control units. Alternatively, the monitoring systems 46a, 46b, and 46c can share a single control unit positioned outside of the processing chamber 18 or within the processing chamber.

To determine a thickness $t_1$ of the component 26, the radiation source 6, the detecting unit 8, and the optical systems 10 and 12 are first positioned such that radiation emitted from the radiation source 6 is directed to an area of the component 26 where thickness measurements are desired. Then, the components of the monitoring system 4 are calibrated based on calibration data stored in the storage area 44. The radiation beam 32 is emitted from the radiation source 6 and is focused onto a first surface 28 of the component 26 by the optical system 10. In the embodiment of FIG. 1, the radiation beam 32 is partially reflected and partially refracted at the first surface 28, resulting in a reflected beam portion 36 and a refracted beam portion 34a. The refracted beam portion 34a is internally transmitted through the component 26 and is partially absorbed by the component 26. A second internal reflection is created at a second surface 30 of the component 26, and the resultant beam portion 34b is subjected to additional absorption as it is internally transmitted to the first surface 28, where it is refracted out of the component 26 as refracted beam portion 34c. Alternatively, to increase the sensitivity of the monitoring system 4, the detecting unit 8 and/or the optical system 12 can be arranged such that the initially refracted portion of the radiation beam 32 is allowed to experience multiple internal reflections inside the component 26 before finally being detected by detecting unit 8.

Figure 2:
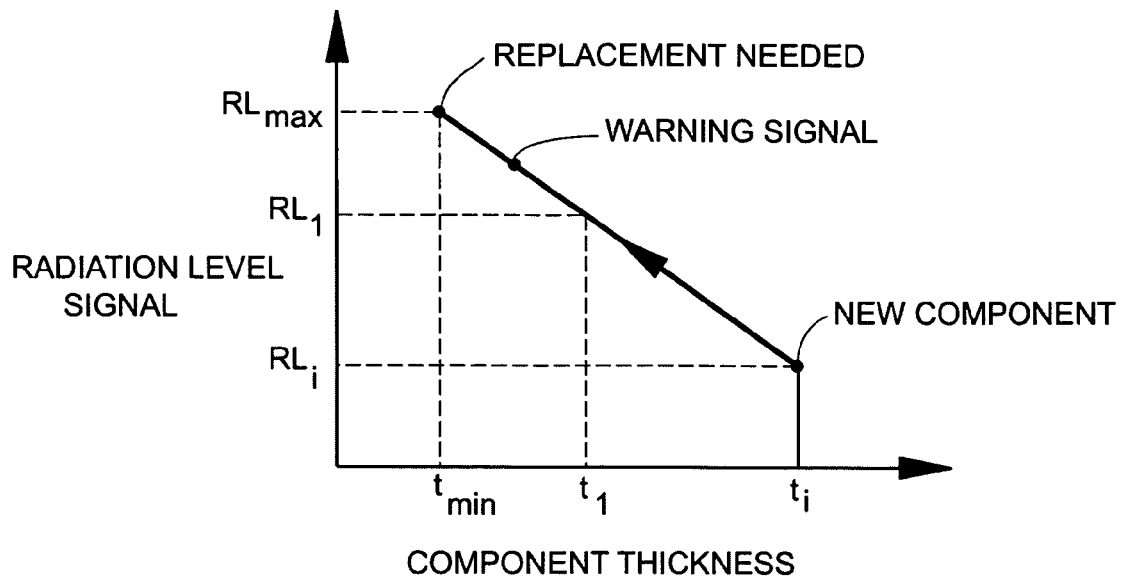
FIG. 2 is an example of radiation level vs. component thickness curve.

As seen in FIG. 1, the reflected beam portion 36 and the refracted beam portion 34c are received by the detecting unit 8 via the optical system 12, and the signal generating unit 40 generates a radiation level signal based on the combined strength of detected beam portions 34c and 36. In this case, in which the thickness of the component is $t_1$, the radiation level signal indicates a radiation level of $RL_1$ (see FIG. 2). The thickness of the component will affect the amount of radiation detected by the detecting unit 8 in that more radiation will be absorbed while being transmitted through the component 26 if the component 26 is relatively thick. Generally, if the component 26 is relatively thick, the generated radiation level signal indicates low radiation because the detecting unit 8 detects mostly the reflected beam portion 36, while most of the refracted beam portion 34a and the reflected beam portion 34b are absorbed inside the component 26, resulting in a relatively weak refracted beam portion 34c. As the component 26 becomes thinner (e.g., from an initial thickness $t_i$ to a thickness $t_1$) due to erosion, less absorption takes place, and the reflected beam portion 36 becomes augmented by the refracted beam portion 34c. In this case, the radiation level signal indicates a relatively high amount of radiation.

The detecting unit 8 transmits the radiation level signal to the control unit 14 via the signal line 22, and the CPU 42 determines the value of thickness $t_1$ based on the received radiation level signal. This determination is performed by processing the radiation level signal in conjunction with correlation data that corresponds to the material of the component 26. The correlation data is stored in storage area 44, along with a minimum thickness $t_{min}$ that represents a minimum thickness that the component 26 is useful and/or safe at (see FIG. 2). Using the chart shown by FIG. 2, a radiation level signal indicating a detected radiation level of $RL_1$ correlates to a component thickness of $t_1$. As a further example, measuring a thickness of a new component 26 will result in a detected radiation level of $RL_i$, which the CPU 42 will correlate to the initial thickness $t_i$ using the correlation data represented by FIG. 2.

In a processing tool in which more than one monitoring system is used to measure thicknesses (e.g., as shown in FIG. 3), the above-described measuring process can be concurrently performed by each monitoring system. Thickness of the component 26 can be determined by averaging the individually determined thicknesses, or each individual measurement can be separately tracked. The latter method allows tool operators to monitor the uniformity of component erosion, ensuring that the component 26 gets replaced when it reaches minimum thickness $t_{min}$ at one or more of the monitoring locations. Multiple monitoring locations also allow redundancy and error checking to be incorporated into the measurement system. For example, if one system malfunctions, the other measurements are used to positively identify the malfunction, and stop using the malfunctioning system.

When the detected radiation level reaches $RL_{max}$, the component 26 has been eroded to the extent that it is no longer useful and/or safe, and the CPU 42 will determine that the minimum thickness $t_{min}$ has been reached. At this point, the control unit 14 will generate and transmit a status signal that indicates that the component 26 must be replaced. The status signal can be used to generate a display for a human operator of the processing tool 2 and/or can be used to automatically halt operation of the processing tool. Additionally, the control unit 14 can generate and transmit a warning signal when the thickness of the component 26 is determined to be at a predetermined thickness slightly greater than the minimum thickness $t_{min}$. For example, the warning signal can indicate that a set number of processes can be performed before the thickness of the component 26 reaches the minimum thickness $t_{min}$.

Initial thickness measurements made by the monitoring system 4 can be used to identify the material, the manufacturer, the serial number, the type, and/or any other characteristics of the component 26. For example, in a processing tool 2 where only two different types of focus rings can be used, each type of focus ring can be manufactured to exhibit its own initial thickness at a particular location, such that the CPU 42 can identify the type of focus ring installed in the processing tool 2 after determining the initial thickness of the focus ring at the particular location. Such identification can be used by the CPU 42 to refer to the calibration data stored in the storage area 44 to calibrate the monitoring system 14 for the installed focus ring type.

Furthermore, for processing tools 2 that use a wide variety of consumable components, counterbores can be machined into each consumable component to form a component identification code that can be interpreted by one or more monitoring systems. For example, FIG. 3 illustrates a component 26 including three counterbores 38. The counterbores 38 are shown as having various depths but can have any combination of equal and unequal depths. Each of the monitoring systems 46a, 46b, and 46c are positioned adjacent to one of the counterbores 38. Initial thickness measurements of the counterbores 38 can be matched as a group to component identification data stored in storage area 44, and an identification of characteristics of the component 26 can be thus determined. Thus, the counterbores 38 can provide a coding scheme that identifies the type of consumable part that is monitored by the monitoring systems.

By taking a first thickness measurement of the component 26 before a tool process, and then by taking a second thickness measurement of the component 26 after performance of the tool process, the CPU 42 can calculate a rate of erosion particular to the material of the component 26 and the process performed. Also, the monitoring system 4 can make repeated thickness measurements during wafer batch runs using different tool processes, and a rate of erosion can be determined by the CPU 42 for every particular process and stored in the storage area 44. Such rate of erosion information for various processes can be used in conjunction with the remaining component thickness information to determine an estimate of the remaining lifetime of a particular component in units of hours, minutes, wafers, or any other suitable unit. Remaining lifetime information can be used for maintenance scheduling, providing tool operators with information of impending part replacements ahead of time, such that these replacements can be combined with other routine maintenance tasks, reducing the number of costly shutdowns of the processing tool 2.

As described above, the various aspects of the present invention provide for a component consumption monitoring system that eliminates the need to take a processing tool off-line for the purpose of opening the processing chamber to measure a consumable component. Accordingly, a consumable component can remain in the processing chamber for its entire useful lifetime, even if the processing tool undergoes various processes. Also, the monitoring system is relatively small and inexpensive such that it can be installed and operated as a retrofit option on existing semiconductor processing tools.

Figure 4:
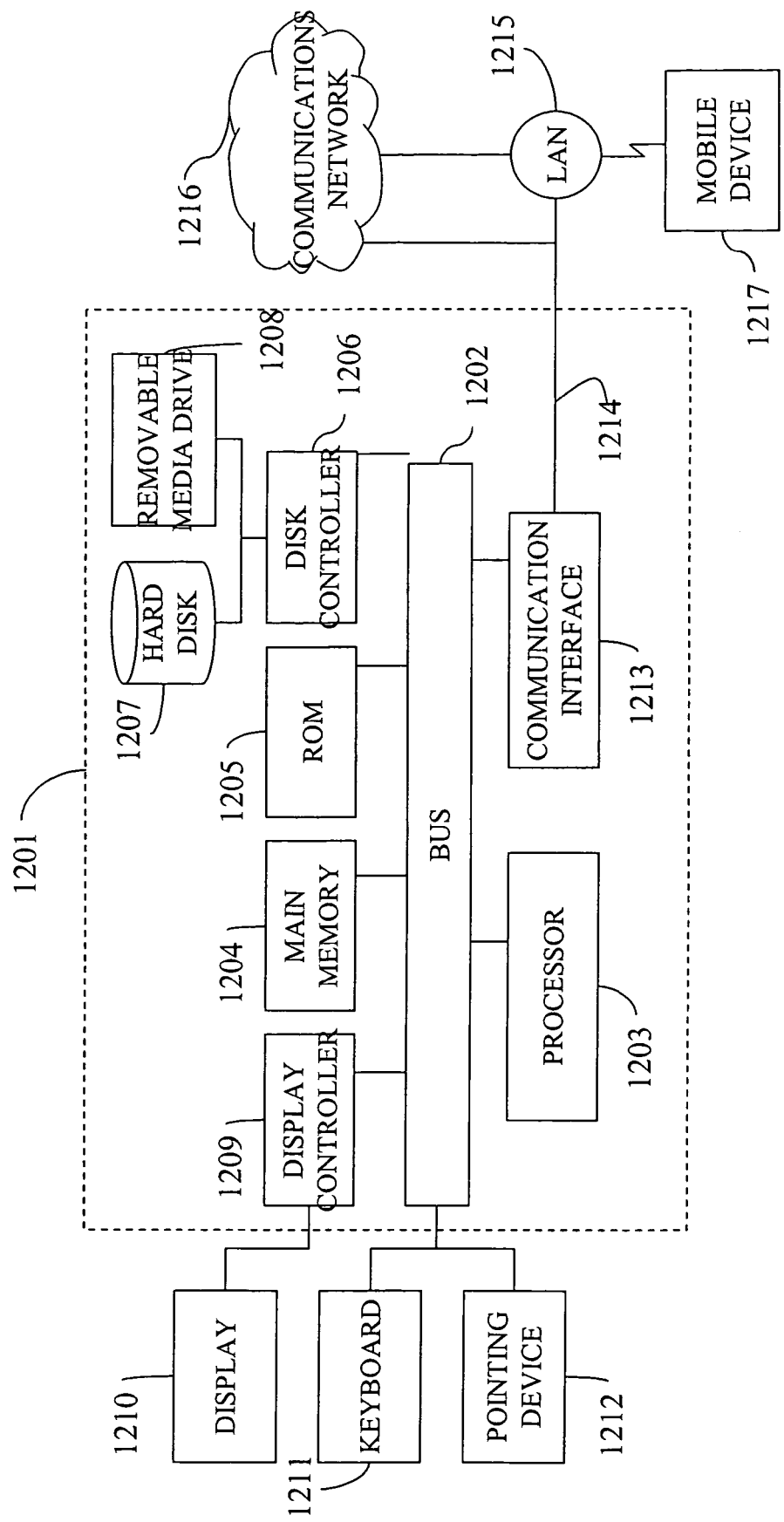
FIG. 4 illustrates a computer system upon which an embodiment of the present invention may be implemented.

FIG. 4 illustrates a computer system 1201 upon which an embodiment of the present invention may be implemented. The computer system 1201 may be used as the control unit 14 or a similar controller that may be used with the systems of FIG. 1 or 3 to perform any or all of the functions described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)). The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used.

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208.

One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention. For example, the present inventors recognize that a consumable part can be monitored using ultrasonic technology by placing an ultrasonic transducer in contact with the part. While this embodiment is feasible, it would be more difficult to retrofit such a monitoring system to an existing processing chamber due to the need for direct contact of the transducer with the consumable part.

As another example, U.S. patent application No. 10/398,652 filed Apr. 14, 2003 and pending (The '652 Application), and 10/168,544 filed Jul. 2, 2002 and issued May 10, 2005 as U.S. Pat. No. 6,891,124 (The '544 Application) disclose a system in which infrared spectroscopy is used to detect the temperature of the silicon wafer undergoing processing. Such a system can be advantageously combined with the system of the present invention using the same infrared radiation source. One or more of the detectors of the present invention may be modified to measure transmission or reflection spectra, from which consumable part temperature can be determined, in the same way as wafer temperature in the '652 and '544 applications. The entire content of each of the '652 and '544 applications is incorporated herein by reference.

What is claimed is:

1. A system for monitoring component consumption, comprising:
   a radiation source configured to emit a radiation beam onto a first area of a consumable component subject to erosion by a manufacturing process, the component having an initial thickness such that the component can withstand a plurality of manufacturing process runs before the erosion requires replacement of the component;
   a detecting unit configured to detect a portion of the radiation beam that is refracted by the component, and to generate a radiation level signal based at least on a strength of the detected portion of the radiation beam; and
   a control unit configured to determine a replacement status of the component based on said radiation level signal.

2. The system of claim 1, wherein said control unit is configured to determine the status of the component by:
   determining a thickness of the component based on the radiation level signal; and
   comparing the thickness of the component to a predetermined thickness value.

3. The system of claim 2, wherein said control unit is further configured to:
   generate a status signal when the thickness of the component is determined to be substantially equal to or below the predetermined thickness value; and
   transmit a command to the radiation source and the detecting unit to generate another radiation level signal when the thickness of the component is determined to be greater than the predetermined thickness value and after the component is exposed to a process that can erode at least a portion of the component.

4. The system of claim 3, wherein the control unit includes a storage area configured to store correlation data that is used to determine the thickness of the component based on the radiation level signal.

5. The system of claim 4, wherein the correlation data includes information correlating radiation levels to thicknesses for a plurality of component materials.

6. The system of claim 2, further comprising:
   a second radiation source configured to emit a second radiation beam onto a second area of the component; and
   a second detecting unit configured to detect a portion of the second radiation beam that is refracted by the component, and to generate a second radiation level signal based at least on a strength of the detected portion of the second radiation beam, wherein the control unit is configured to determine the thickness of the component based on at least one of the radiation level signal and the second radiation level signal.

7. The system of claim 6, wherein:
   the first area of the component includes a first recessed portion,
   the second area of the component includes a second recessed portion, and
   the control unit is configured to identify at least one of a material, a manufacturer, a serial number, and a type of the component based at least on determined initial thicknesses of the first recessed portion and the second recessed portion.

8. The system of claim 1, wherein the detected portion of the radiation beam is a portion of the radiation beam that is refracted a first time by a first surface of the component, transmitted through the component, reflected by a second surface of the component, and refracted a second time by the first surface of the component.

9. The system of claim 1, wherein the radiation beam is an infrared beam.

10. The system of claim 1, wherein the radiation source and the detecting unit are positioned within a processing chamber, and the control unit is positioned outside of the processing chamber.

11. The system of claim 1, wherein the detecting unit is configured to wirelessly transmit the radiation level signal to the control unit.

12. The system of claim 1, wherein the component comprises a semiconductor material.

13. The system of claim 1, wherein at least one of the radiation source and the detecting unit is configured to receive power from radiofrequency power in a plasma tool.

14. A system for monitoring component consumption, comprising:
   means for emitting a radiation beam onto a first area of a consumable component subject to erosion by a manufacturing process, the component having an initial thickness such that the component can withstand a plurality of manufacturing process runs before the erosion requires replacement of the component;
   means for detecting a portion of the radiation beam that is refracted by the component, and for generating a radiation level signal based at least on a strength of the detected portion of the radiation beam; and
   means for determining a replacement status of the component based on said radiation level signal.

15. The system of claim 14, wherein said means for determining further comprises:
   means for determining a thickness of the component based on the radiation level signal; and
   means for comparing the thickness of the component to a predetermined thickness value.

16. The system of claim 15, wherein said means for determining a replacement status of the component further comprises:
   means for generating a status signal when the thickness of the component is substantially equal to or below the predetermined thickness value, and
   means for transmitting a command to the emitting means and the detecting means to generate another radiation level signal when the thickness of the component is determined to be greater than the predetermined thickness value and after the component is exposed to a process that can erode at least a portion of the component.

17. The system of claim 15, further comprising:
second means for emitting a second radiation beam onto a second area of the component; and
second means for detecting a portion of the second radiation beam that is refracted by the component, and for generating a second radiation level signal based at least on a strength of the detected portion of the second radiation beam, wherein the means for determining includes means for determining the thickness of the component based on at least one of the radiation level signal and the second radiation level signal.

18. The system of claim 17, wherein:
the first area of the component includes a first recessed portion,
the second area of the component includes a second recessed portion, and
the means for determining includes means for identifying at least one of a material, a manufacturer, a serial number, and a type of the component based at least on determined initial thicknesses of the first recessed portion and the second recessed portion.

19. The system of claim 14, wherein the detected portion of the radiation beam is a portion of the radiation beam that is refracted a first time by a first surface of the component, transmitted through the component, reflected by a second surface of the component, and refracted a second time by the first surface of the component.

20. The system of claim 14, wherein the radiation beam is an infrared beam.

21. The system of claim 14, wherein the means for detecting includes means for wirelessly transmitting the radiation level signal to the means for determining.

22. The system of claim 14, wherein the component is made of a semiconductor material.

23. The system of claim 14, wherein at least one of the emitting means and the means for detecting is powered by radiofrequency power in a plasma tool.

24. A method for monitoring consumption of a component, comprising:
emitting a radiation beam onto a first area of a consumable component subject to erosion by a manufacturing process, the component having an initial thickness such that the component can withstand a plurality of first manufacturing process runs before the erosion requires replacement of the component;
detecting a portion of the radiation beam that is refracted by the component;
generating a radiation level signal based at least on a strength of the detected portion of the radiation beam; and
determining a replacement status of the component based on said radiation level signal.

25. The method of claim 24, wherein said determining a replacement status comprises:
determining a thickness of the component based on a strength of said radiation level signal; and
comparing the thickness of the component to a predetermined thickness value.

26. The method of claim 25, wherein said determining a replacement status further comprises:
exposing the component to a process that can erode at least a portion of the component when the comparing step determines that the thickness of the component is greater than the predetermined thickness value;
repeating the determining a thickness of the component step, the comparing step, and the exposing step until the comparing step determines that the thickness of the component is substantially equal to or less than the predetermined thickness value; and
generating a status signal when the comparing step determines that the thickness of the component is substantially equal to or less than the predetermined thickness value.

27. The method of claim 26, wherein the exposing step includes:
exposing the component to a second manufacturing process that can erode at least a portion of the component, wherein the first and second manufacturing processes are different,
the method further comprising:
determining a second rate of erosion of the component corresponding to the second manufacturing process based on at least two thickness measurements of the component.

28. The method of claim 26, wherein the exposing step includes:
exposing the component to plasma processing.

29. The method of claim 25, further comprising:
measuring an initial thickness of the component; and
identifying at least one of a material, a manufacturer, a serial number, and a type of the component based at least on the initial thickness of the component.

30. The method of claim 29, wherein the step of measuring an initial thickness of the component includes determining a thickness of a recessed portion of the component.

31. The method of claim 25, further comprising:
determining a rate of erosion of the component corresponding to a first manufacturing process based on at least two thickness measurements of the component.

32. The method of claim 31, further comprising:
calculating a remaining life of the component based on the rate of erosion.

33. The method of claim 25, wherein the determining a thickness of the component step includes:
referring to stored correlation data to determine the thickness of the component based on the radiation level signal.

34. The method of claim 33, wherein the correlation data includes information correlating radiation levels to thicknesses for a plurality of component materials.

35. The method of claim 25, further comprising:
emitting a second radiation beam onto a second area of the component; and
detecting a portion of the second radiation beam that is refracted by the component; and
generating a second radiation level signal based at least on a strength of the detected portion of the second radiation beam, wherein the determining a thickness of the component step includes determining the thickness of the component based on at least one of the radiation level signal and the second radiation level signal.

36. The method of claim 24, wherein the generating step comprises:
generating the radiation level signal as a wireless signal.

37. The method of claim 24, wherein the detected portion of the radiation beam is a portion of the radiation beam that is refracted a first time by a first surface of the component, transmitted through the component, reflected by a second surface of the component, and refracted a second time by the first surface of the component.

38. The method of claim 24, wherein the radiation beam is an infrared beam.

39. The method of claim 24, wherein the component is made of a semiconductor material.

40. A system for identifying a component, comprising:
a radiation source configured to emit a radiation beam onto a first area of the component, the first area of the component including a first recessed portion;
a first detecting unit configured to detect a portion of the radiation beam that is refracted by the component, and to generate a first radiation level signal based at least on a strength of the detected portion of the radiation beam;
a second radiation source configured to emit a second radiation beam onto a second area of the component, the second area of the component including a second recessed portion;
a second detecting unit configured to detect a portion of the second radiation beam that is refracted by the component, and to generate a second radiation level signal based at least on a strength of the detected portion of the second radiation beam; and
a control unit configured to determine the initial thickness of the first recessed portion based on the first radiation level signal, determine the initial thickness of the second recessed portion based on the second radiation level signal, and identify at least one of a material, a manufacturer, a serial number, and a type of the component based at least on determined initial thicknesses of the first recessed portion and the second recessed portion.

* * * * *